(12) United States Patent
Shum et al.

(10) Patent No.: US 9,461,488 B2
(45) Date of Patent: Oct. 4, 2016

(54) BATTERY WITH INTEGRATED POWER INVERTER

(76) Inventors: Henry Shum, Hong Kong (CN); Mathew Inskeep, Boca Raton, FL (US)

( * ) Notice: Subject to any disclaimer, the term of this patent is extended or adjusted under 35 U.S.C. 154(b) by 1023 days.

(21) Appl. No.: 13/490,590

(22) Filed: Jun. 7, 2012

(65) Prior Publication Data

US 2012/0313431 A1    Dec. 13, 2012

Related U.S. Application Data

(60) Provisional application No. 61/520,411, filed on Jun. 9, 2011.

(51) Int. Cl.
| | | |
|---|---|---|
| *B60L 1/00* | (2006.01) | |
| *B60L 3/00* | (2006.01) | |
| *H02G 3/00* | (2006.01) | |
| *H02J 7/00* | (2006.01) | |
| *H02M 7/00* | (2006.01) | |
| *H05K 7/14* | (2006.01) | |

(52) U.S. Cl.
CPC ............ *H02J 7/0042* (2013.01); *H02J 7/0065* (2013.01); *H02M 7/003* (2013.01); *H05K 7/1432* (2013.01); *H01M 2220/20* (2013.01); *Y10T 29/49117* (2015.01)

(58) Field of Classification Search
CPC ............ H02J 7/00; H02J 7/0042; H02J 7/14; H02J 7/0065; B60L 1/006
USPC .......................................... 307/9.1; 429/163
See application file for complete search history.

(56) References Cited

U.S. PATENT DOCUMENTS

| | | | |
|---|---|---|---|
| 4,920,475 A | 4/1990 | Rippel | |
| 5,982,138 A | 11/1999 | Krieger | |
| 6,596,941 B2 * | 7/2003 | Tripoli | 174/68.1 |
| 7,149,099 B2 | 12/2006 | Asbery | |
| 7,584,626 B2 | 9/2009 | Bellero et al. | |
| 7,626,356 B2 * | 12/2009 | Elgie et al. | 320/107 |
| 7,641,013 B2 | 1/2010 | Kim et al. | |
| 7,828,692 B2 | 11/2010 | Hayashi et al. | |

(Continued)

FOREIGN PATENT DOCUMENTS

JP    2003-086157 A    3/2003

OTHER PUBLICATIONS

Krampitz, Iris, "Outback's stand-alone inverters with integrated battery chargers," PHOTON International The Solar Power Magazine, Jan. 2003.

(Continued)

*Primary Examiner* — Carlos Amaya
(74) *Attorney, Agent, or Firm* — FisherBroyles, LLP; Robert Kinberg

(57) ABSTRACT

A vehicle battery having an integrated power inverter includes an outer housing having a positive terminal and a negative terminal located exterior to the outer housing; a battery located in the outer housing, the battery having a positive output and a negative output that together output a DC current, wherein the positive output is coupled to the positive terminal and the negative output is coupled to the negative terminal; a power inverter located in the outer housing, the power inverter having a DC input coupled to the positive and negative outputs of the battery, and an AC output; and an AC socket coupled to the AC output. A shell for a vehicle battery having an integrated power inverter, and a method of making a vehicle battery having an integrated power inverter are also described.

26 Claims, 6 Drawing Sheets

(56) References Cited

U.S. PATENT DOCUMENTS

| | | | |
|---|---|---|---|
| 7,997,377 B2 | 8/2011 | Kim et al. | |
| 2001/0043052 A1* | 11/2001 | Griffey et al. | 320/114 |
| 2007/0024236 A1* | 2/2007 | Arakelian | 320/107 |
| 2009/0107746 A1 | 4/2009 | Horie et al. | |
| 2010/0102772 A1 | 4/2010 | Smith | |
| 2011/0080044 A1 | 4/2011 | Schmiegel | |

OTHER PUBLICATIONS

Rippel, Wally, "Integrated Inverter and Battery Charger," Mendeley Ltd., 2011.

"RedFlow Power+BOS LA 600 Ah Integrated Battery and Inverter," Energy Matters Pty Ltd., 2005-2010.

\* cited by examiner

BATTERY WITH INTEGRATED POWER INVERTER

CROSS-REFERENCE TO RELATED APPLICATIONS

This application claims priority under 35 U.S.C. §119(e) of Applicant's U.S. Provisional Application No. 61/520,411 filed Jun. 9, 2011, the entire contents of which are incorporated herein by reference.

TECHNICAL FIELD

This patent application relates generally to batteries for vehicles such as automobiles, watercraft, and the like. More specifically, this patent application relates to a battery having an integrated power inverter that provides an auxiliary AC power source.

BACKGROUND

Nearly all vehicles, such as automobiles, watercraft, and the like, include a battery for storage of DC power. The battery is typically used to power the starter for the vehicle's motor, and/or to power other components of the vehicle, such as the stereo or lights. In the event the operator of the vehicle needs to power an AC device, such as a television or microwave oven, the operator can use a power inverter that attaches to the vehicle's battery using cables that clamp to the battery posts. However, there remains a need for a battery having an integrated power inverter for the supply of AC power from the battery.

SUMMARY

According to an embodiment, a vehicle battery having an integrated power inverter comprises: an outer housing having a positive terminal and a negative terminal located exterior to the outer housing; a battery located in the outer housing, the battery having a positive output and a negative output that together output a DC current, wherein the positive output is coupled to the positive terminal and the negative output is coupled to the negative terminal; a power inverter located in the outer housing, the power inverter having a DC input coupled to the positive and negative outputs of the battery, and an AC output; and an AC socket coupled to the AC output.

According to another embodiment, a shell for a vehicle battery having an integrated power inverter comprises: an outer housing having a hollow interior portion adapted to hold a battery; a positive terminal and a negative terminal located exterior to the outer housing, the positive and negative terminals extending into the hollow interior portion and adapted to couple to a positive output and a negative output of the battery, respectively; a power inverter located in the outer housing, the power inverter having a DC input adapted to couple to the positive and negative outputs of the battery, the power inverter also having an AC output; and an AC socket connected to the AC output.

According to another embodiment, a method of making a vehicle battery having an integrated power inverter comprises: providing an outer housing having a hollow interior; inserting a battery into the hollow interior region, the battery having a positive output and a negative output; installing a power inverter in the outer housing; coupling a DC input of the power inverter to the positive and negative outputs of the battery, wherein the power inverter has an AC output; coupling the positive output to a positive terminal located exterior to the outer housing; coupling the negative output to a negative terminal located exterior to the outer housing; and coupling an AC socket to the AC output of the power inverter.

Further aspects, objectives, and advantages, as well as the structure and function of embodiments, will become apparent from a consideration of the description, drawings, and examples.

BRIEF DESCRIPTION OF THE DRAWINGS

The foregoing aspects and other features and advantages of the invention will be apparent from the following drawings, wherein like reference numbers generally indicate identical, functionally similar, and/or structurally similar elements.

DETAILED DESCRIPTION

Embodiments of the invention are discussed in detail below. In describing embodiments, specific terminology is employed for the sake of clarity. However, the invention is not intended to be limited to the specific terminology so selected. A person skilled in the relevant art will recognize that other equivalent parts can be employed and other methods developed without departing from the spirit and scope of the invention. All references cited herein are incorporated by reference as if each had been individually incorporated.

Disclosed is a vehicle battery, such as a 6 Volt or 12 Volt DC battery, having a DC-to-AC power inverter integrated into the vehicle battery. The battery itself and the power inverter are contained in the same housing, thus providing a single unit that can provide the DC power necessary to power the vehicle's starter and other systems, while at the same time providing an AC power output that the operator can use to power AC devices, such as televisions, microwaves, and household tools. According to an embodiment, the battery with integrated power inverter (referred to hereinafter as the "integrated battery") can have the same general exterior dimensions and/or mounting features as a conventional vehicle battery, allowing the integrated battery to serve as a drop-in replacement for a vehicle's existing battery. Alternatively, the integrated battery can be installed in new vehicles at the time of manufacture. The AC power output can be located directly on the integrated battery itself, or can be attached to the integrated battery by an extension cable, allowing the AC power output to be located remotely from the integrated battery, e.g., in the vehicle's cabin or in the area surrounding the vehicle's exterior.

Figure 1:
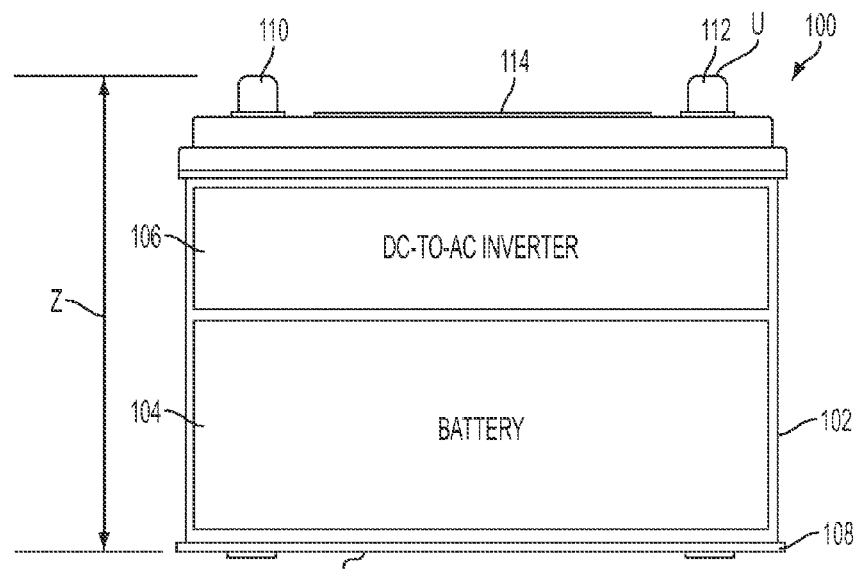
FIG. 1 is a side, schematic view of an embodiment of a battery with integrated power inverter.
Figure 2A:
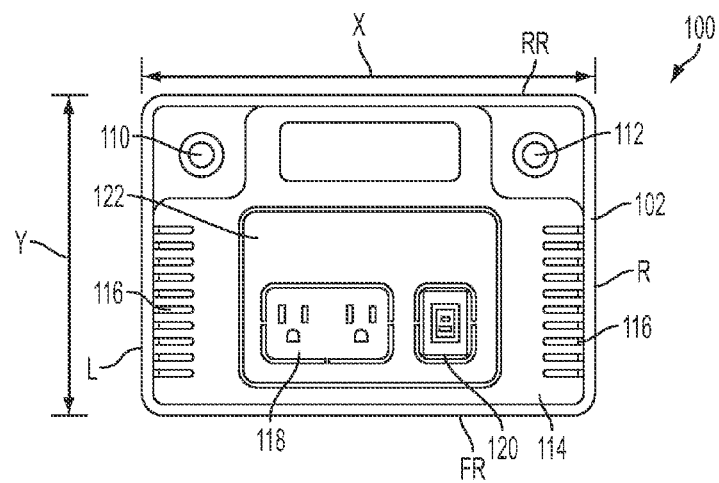
FIG. 2A is a top, schematic view of the battery with integrated power inverter of FIG. 1.
Figure 2B:
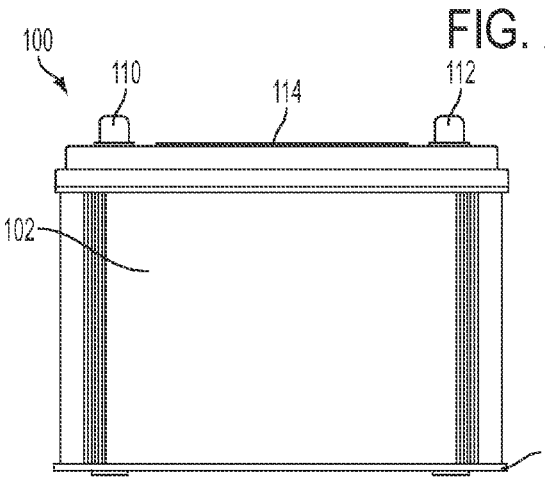
FIG. 2B is a side, schematic view of the battery with integrated power inverter of FIG. 1.
Figure 2C:
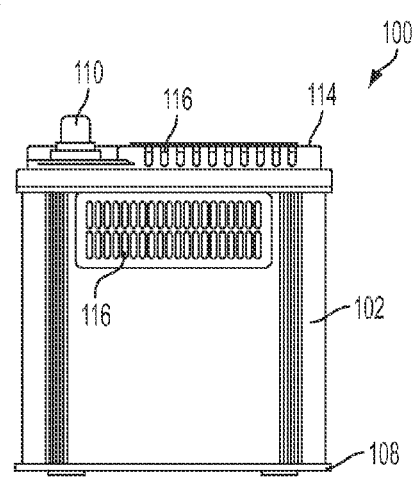
FIG. 2C is an end, schematic view of the battery with integrated power inverter of FIG. 1.

Referring to FIGS. 1 and 2, an embodiment of an integrated battery 100 is shown. FIG. 1 is a side, schematic view of the integrated battery 100. FIGS. 2A, 2B, and 2C are top, side, and end views of the integrated battery 100. As shown, the integrated battery 100 can include an outer housing 102 that is generally rectangular in shape. The outer housing 102 can house a battery 104 and a DC-to-AC power inverter 106, as shown schematically in FIG. 1. The battery 104 can comprise any one of a number of vehicle batteries known in the art, such as a lead-acid battery, or a maintenance free battery such as a gel cell battery or an absorbed glass mat ("AGM") battery. The outer housing 102 can include a peripheral ridge 108 extending along the lower edge of the outer housing 102 to facilitate mounting the integrated battery 100 in a vehicle using conventional mounting techniques and structures, as will be understood by one of ordinary skill in the art based on this description.

A positive battery terminal 110 and a negative battery terminal 112 can extend to the exterior of the outer housing 102 of the integrated battery 100 for connection to the vehicle's DC power system using the vehicle's connectors. The positive and negative terminals 110, 112 can be made from a conductive material, such as lead or zinc. While the positive and negative battery terminals 110, 112 are shown as generally frustoconical posts (like SAE and JIS posts), other embodiments are possible. For example, the battery terminals 110, 112 can alternatively comprise threaded studs, or L-shaped bars with or without a hole for receiving a fastener connected to a power cable. Alternatively, the battery terminals 110, 112 can comprise tabs or universal connectors (e.g., side-posts) that may accept a variety of different bolts or adapters for interconnection with a vehicle's DC power system. Accordingly, the battery terminals 110, 112 can comprise any type of positive and negative terminals, respectively, that can electrically connect the battery 104 to a vehicle's DC power system.

In the embodiment shown in FIGS. 1 to 2C, the positive and negative battery terminals 110, 112 extend from the top surface 114 of the integrated battery 100, however, other configurations are possible. For example, the positive and negative battery terminals 110, 112 can alternatively extend from other surfaces of the integrated battery 100, such as the sides, depending on the installation requirements.

Still referring to FIGS. 1 to 2C, the power inverter 106 can be located in the outer housing 102 above the battery 104, however, other configurations are possible. For example, the battery 104 can alternatively be located in the outer housing 102 on top of the power inverter 106, or the battery 104 and power inverter 106 can be arranged in the housing 102 in a side-by-side manner. Alternatively, the components of the battery 104 and the inverter 106 can be intermingled with one another within outer housing 102.

As shown in FIGS. 2A and 2C, the outer housing 102 can include one or more vents 116 to cool the battery 104 and/or the power inverter 106. Although not visible, fans can be located in the outer housing 102 to draw air over the battery 104 and/or power inverter 106 and to discharge warm air out of the vents 116.

Referring now to FIG. 2A, one or more AC sockets 118 can be located on the exterior surface of the outer housing 102. The AC socket 118 can comprise, for example, a conventional 2-prong or 3-prong socket that provides 110V AC current for powering conventional household devices, however, other configurations are possible. In the embodiment shown in FIG. 2A, two AC sockets 118 are shown, however, the integrated battery 100 may alternatively have more or fewer AC sockets located in various places. Additionally or alternatively, one or more of the AC sockets 118 can be located remotely from the outer housing 102, as will be described in more detail below. The integrated battery 100 can include a switch 120 that turns the power inverter 104 and/or the corresponding AC socket 118 on or off. In the embodiment shown in FIGS. 1 to 2C, the AC sockets 118 and switch 120 are located on a power panel 122 (see FIG. 2A) located on the top surface 114 of the outer housing 102, however, other configurations are possible.

Figure 3:
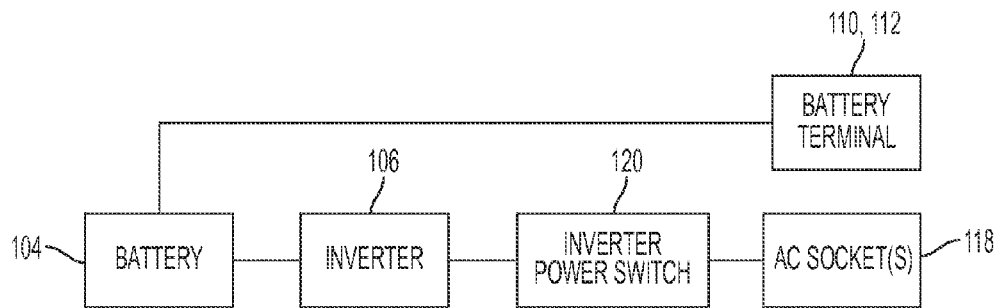
FIG. 3 is a block diagram depicting an embodiment of electronic components for a battery with integrated power inverter.

FIG. 3 is a block diagram depicting an embodiment of the electronic components for the integrated battery 100. As shown, the DC outputs of the battery 104 can be electrically coupled to the battery terminals 110, 112 for distribution of DC power to the vehicle. In addition, the DC outputs of battery 104 can be electrically coupled to the inputs of the DC-to-AC power inverter 106, which converts the DC current output by the battery 104 to AC current output by the AC socket 118. As discussed previously, a switch 120 can turn the power inverter 106 and/or the AC socket 118 on and off.

Figure 4:
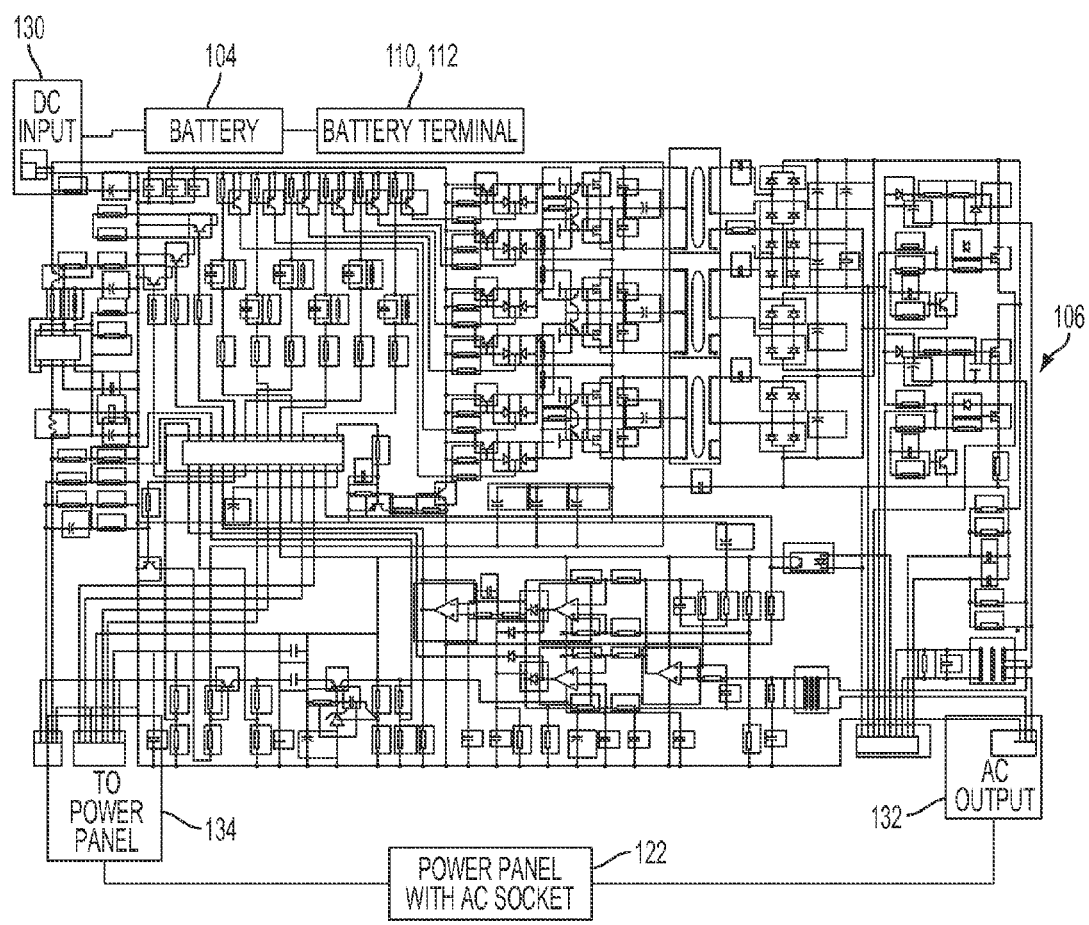
FIG. 4 is a circuit diagram of an embodiment of a battery with integrated power inverter.

FIG. 4 is a circuit diagram of an embodiment of the integrated battery 100. As shown, the power inverter 106 includes a DC input 130, which receives DC power from the battery 104 by either a direct or indirect connection with the battery's positive and negative outputs (e.g., terminals). The integrated battery's positive and negative terminals 110, 112, which extend to the exterior of the outer housing 102, are also connected to the battery 104, e.g., by direct or indirect connection with the battery's positive and negative outputs.

Still referring to FIG. 4, the power inverter 106 also includes an AC output 132, which outputs AC power. The AC output can be directly or indirectly connected to the AC socket 118, which in the embodiment shown, is located in power panel 122. The power inverter 106 can also include a control section 134 that operates, for example, to turn the power inverter 106 and/or the AC socket 118 on and off. The control section 134 can be directly or indirectly connected to the switch 120, discussed above. The remaining circuit components of the power inverter 106 are conventional in nature, and will not be described in more detail herein. Accordingly, any known power inverter circuit that can convert a DC power input into an AC power output can be used for the power inverter 106. According to an embodiment, power inverter 106 is capable of outputting continuous AC power of between about 100 and about 200 watts, and peak AC power of between about 500 and about 1000 watts, however, other ratings are possible. According to an embodiment, the positive and negative terminals 110, 112 can output DC power at the same time the power inverter 106 is in operation to output AC power.

Figure 5:
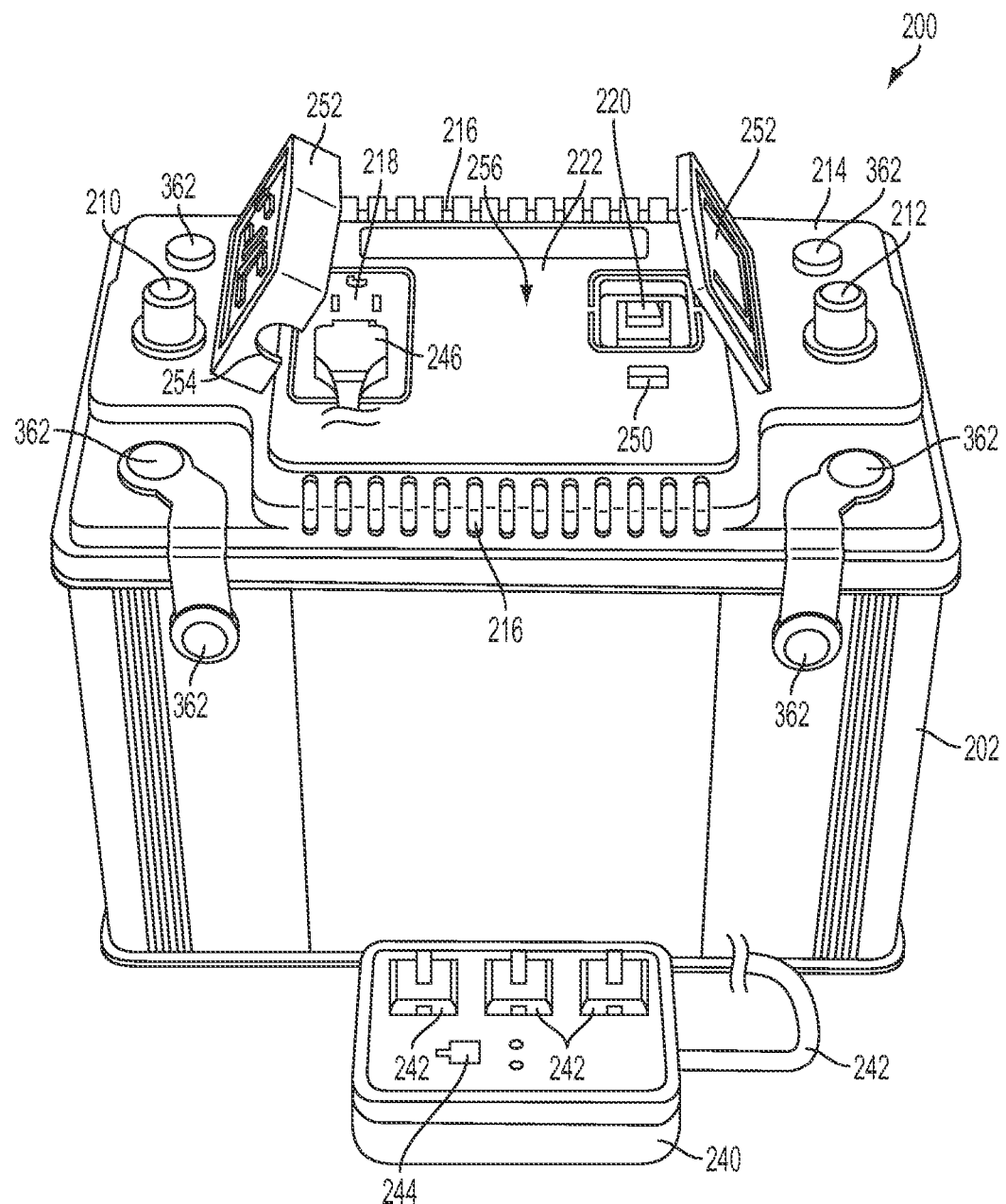
FIG. 5 is a top-side perspective view of a second embodiment of a battery with integrated power inverter.

FIG. 5 is a top-side perspective view of a second embodiment of an integrated battery 200. Integrated battery 200 is similar in structure and function to the embodiment shown in FIGS. 1-4, and accordingly, only differences, additions, or features not previously discussed will be described in connection with FIG. 5. According to an embodiment, the integrated battery 200 can have an AC output that is located remotely from the integrated battery 200, allowing the user flexibility in accessing the AC power at a location inside the vehicle cabin, or in the proximity of the vehicle. As shown, the integrated battery 200 can include a remote module 240 that is connected to the integrated battery 200 by a cable 242. The remote module 240 can include one or more AC sockets 242 that can receive AC power from the power inverter 204 via cable 242. Additionally or alternatively, the remote module 242 can include a remote switch 244, which can function to turn the power inverter 206 and/or the AC outlets 242 on and off in a similar manner to switch 120 described above. Additionally or alternatively, the remote module can include a USB port electrically connected to the battery (not shown in FIG. 5) so that the USB port 250 can be used, for example, to power or charge a portable electronic device, such as a smart phone or camera. The remote switch 244 and/or USB port can connect to power inverter 206 via cable 242. According to an embodiment, the remote module 240 can be adapted for mounting in the vehicle's cabin.

The remote module 240 can be provided as an alternative to the AC outlets 218 and/or switch 220 located in the top surface 214 of outer housing 202, or alternatively, can be provided in addition thereto, as in the embodiment shown. In the embodiment shown, the remote module 240 can be connected to the integrated battery 200 by plugging in a plug 246, located at the end of cable 242, into one of the AC outlets 218 on the outer housing 202, however, a permanent connection can also be utilized. In addition, other methods for connecting the remote module 240 to the power inverter 206 besides using one of the sockets 218 can also be utilized. Furthermore, the remote module 240 can also include a DC power output. According to an embodiment, the cable 242 can be between about 10 and about 30 feet in length, for example, about 15 feet long.

Still referring to FIG. 5, the integrated battery 200 can further include a USB port 250, for example, located on the outer housing 202 and/or the remote module 240. The USB port 250 can be electrically connected to the battery (not shown) so that the USB port 250 can be used, for example, to power or charge a portable electronic device, such as a smart phone or camera.

Figure 6:
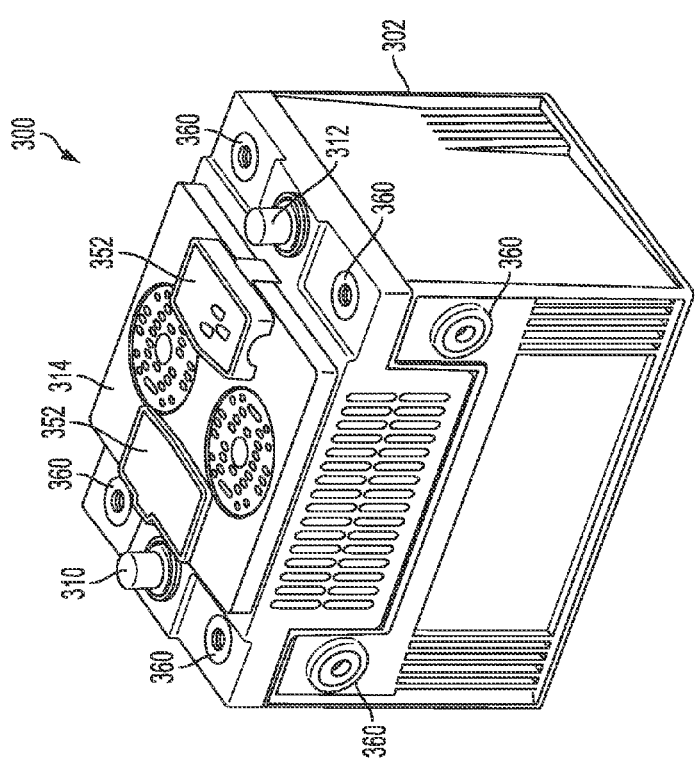
FIG. 6 is a side-end perspective view of a third embodiment of a battery with integrated power inverter.

The integrated battery 200 can include covers 252 that cover the AC socket 218 and/or the switch 220 and USB port 250. The covers 252 can be hinged or otherwise movably connected to the outer housing 202 in a manner that allows the user to open and close covers 252 to gain access to the AC socket 218, switch 220, and/or USB port 250 as needed. The covers 252 are shown in an open position in FIG. 5, however, FIG. 6 shows a similar embodiment with the covers 352 in a closed position. The cover 252 for the AC socket 218 can include a relief groove 254 that allows the cable 242 to fit under the cover 252 when plug 246 is in the socket 218 and the cover 252 is closed, allowing the cover 252 to lay flat on the top surface 214 of the outer housing 202. The integrated battery 200 can include a flat area 256 or channel extending laterally across the top surface 214 of outer housing 202 to provide space for a conventional battery mounting strap (not shown).

FIG. 6 is a side-end perspective view of a third embodiment of an integrated battery 300. Integrated battery 300 is similar in structure and function to the embodiments shown in FIGS. 1-5, and accordingly, only differences, additions, or features not previously discussed will be described in connection with FIG. 6. As shown in FIG. 6, the integrated battery 300 can have a plurality of threaded pads 360 mounted in or on the outer housing 302, for example, on the top surface 314 or on the sides of outer housing 302. The threaded pads 360 may be made of conductive material, such as lead or zinc, and can be directly or indirectly connected to the DC outputs of the battery 304 (see FIG. 8). The threaded pads 360 can have a female thread that receives a variety of different bolts or adapters, such as side posts, for interconnection with a vehicle's DC power system. Alternatively or additionally, the threaded pads 360 may be used to mount the integrated battery 300 to a vehicle. Referring back to FIG. 5, caps 362 may thread into and cover the threaded pads 360 when not in use.

Figure 7:
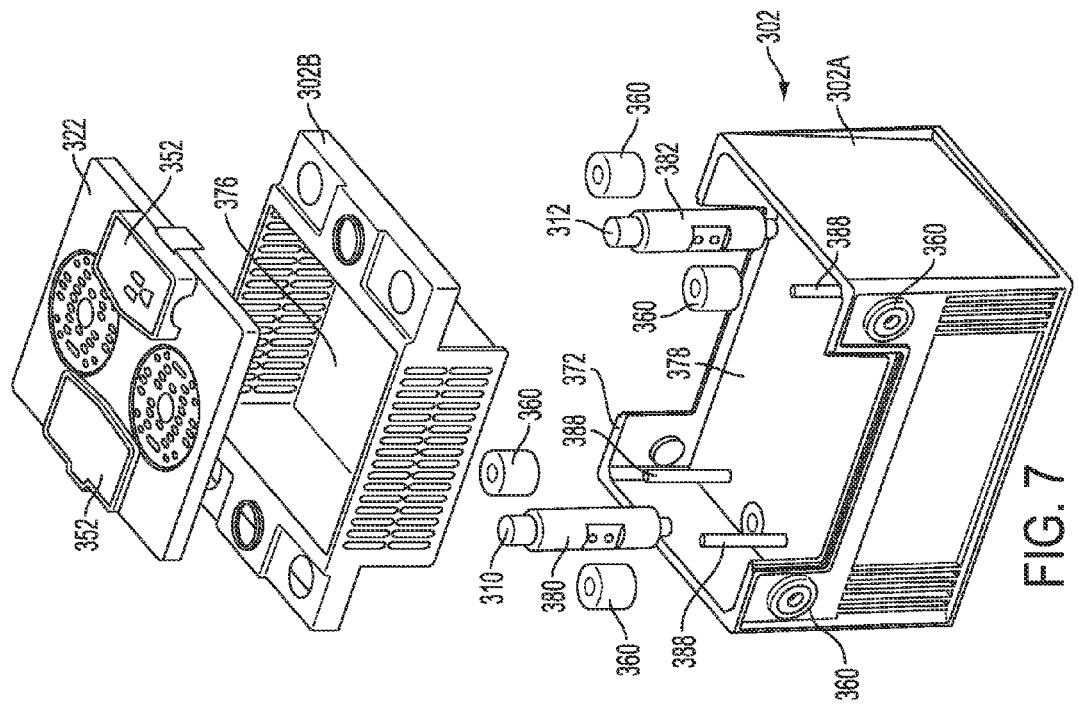
FIG. 7 is an exploded view of the battery with integrated power inverter of FIG. 6.
Figure 8:
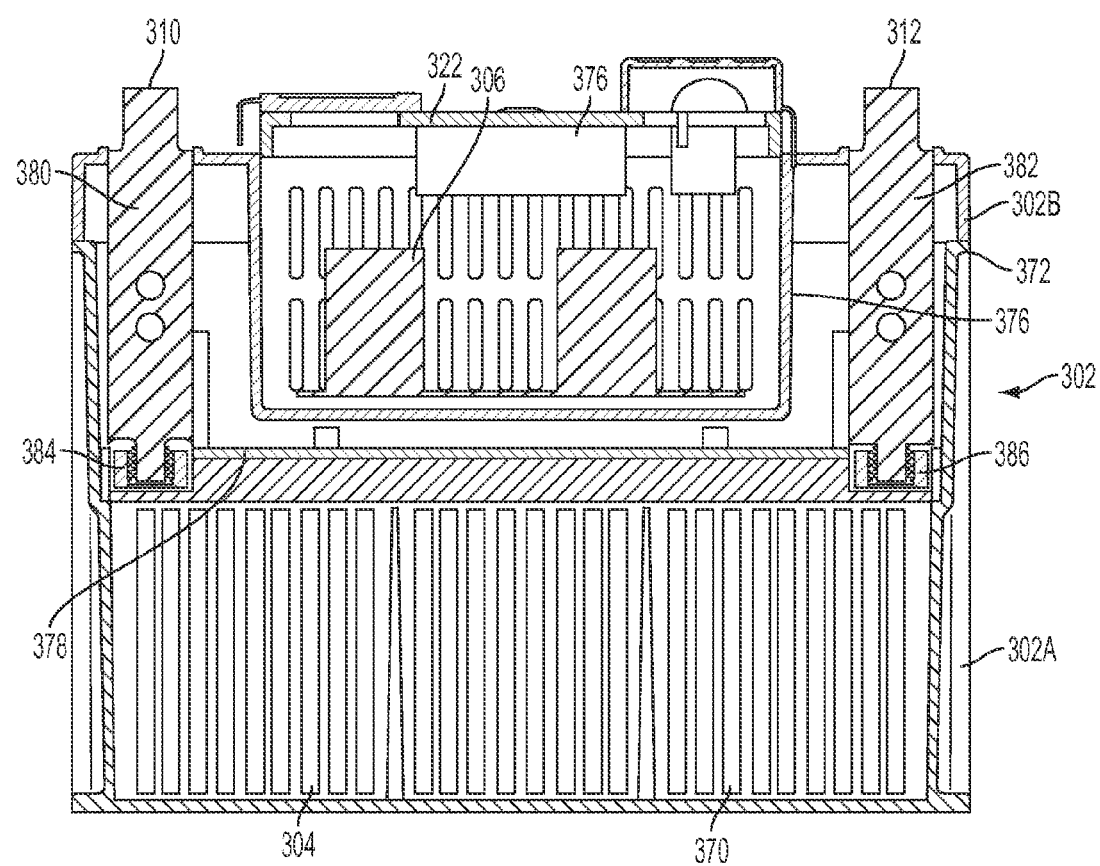
FIG. 8 is a longitudinal cross-sectional view of the battery with integrated power inverter of FIG. 6.

FIG. 7 is an exploded view of the integrated battery 300 of FIG. 6. FIG. 8 is a longitudinal cross-sectional view of the integrated battery 300. Referring to FIGS. 7 and 8 together, the outer housing 302 can include a bottom portion 302A that defines a hollow interior region 370 and an open top 372. The battery 304 can occupy the hollow interior region 370. The outer housing 302 can also include a top cover 302B that covers at least a portion of the open top 372 of the bottom portion 302A, thereby securing the battery 304 in the bottom portion 302A. The power inverter 306 can be housed in the top cover 302B, above the battery 304, as shown in FIG. 8. For example, the top cover 302B can define a cavity 376 that houses the circuitry and/or other components of the power inverter 306. A substantially horizontal partition plate 378 can be located in the bottom portion 302A between the battery 304 and the power inverter 306, for example, to thermally and/or conductively isolate the two components.

Still referring to FIGS. 7 and 8, the positive and negative terminals 310, 312 can extend upward from the top cover 302B. For example, in the embodiment shown, the positive and negative terminals 310, 312 can each comprise a post 380, 382, respectively, formed from a conductive material such as lead or zinc. The posts 380, 382 can be connected to the positive and negative outputs 384, 386 of the battery 304. For example, the posts 380, 382 can be threaded into the positive and negative outputs 384, 386, however, other types of electrical connections are also possible, such as soldering or forced direct contact between the parts. The posts 380, 382 can extend upward from the battery 304 such that the positive and negative terminals 310, 312 extend from the top cover 302B. Referring to FIG. 7, the threaded pads 360 can be electrically coupled to the DC outputs of the battery 304 using conductive rods 388, wires, or other conductive elements known in the art.

Figure 9A:
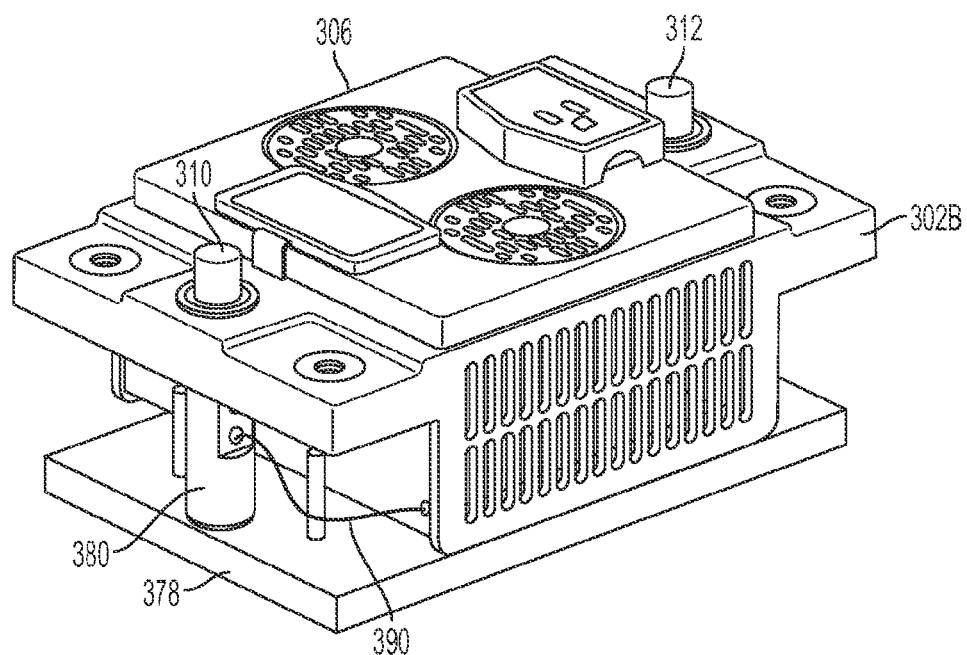
FIG. 9A is an end-side perspective view of an embodiment of a top cover and power inverter of the battery with integrated power inverter of FIG. 6.
Figure 9B:
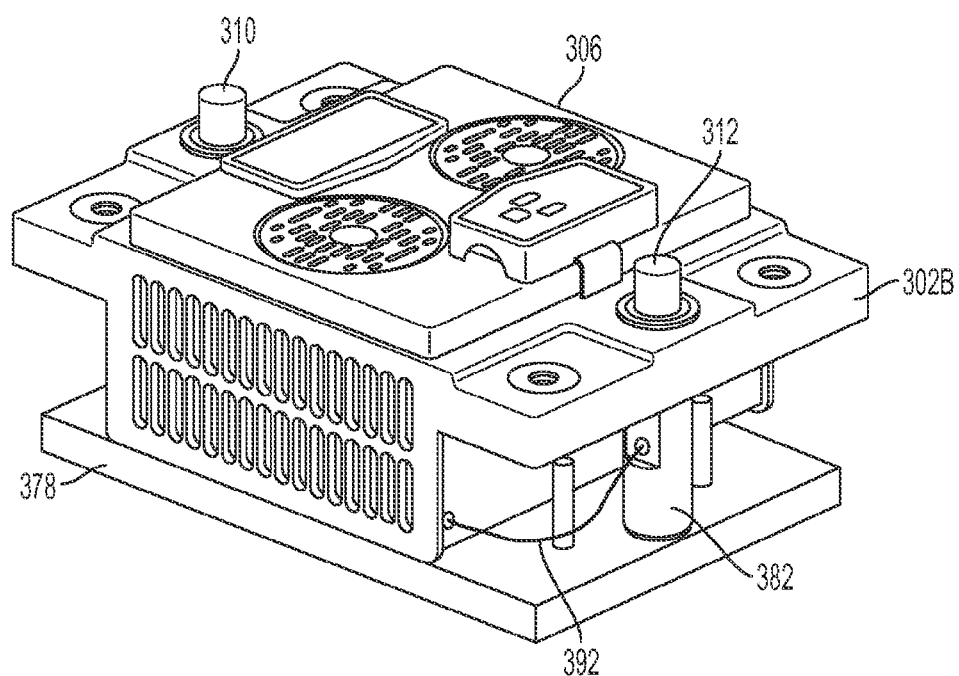
FIG. 9B is a side-end perspective view of the top cover and power inverter of FIG. 9A.

FIG. 9A is an end-side perspective view of an embodiment of the top cover 302B and power inverter 306, and FIG. 9B is a side-end perspective view of the same. As shown in FIGS. 9A and 9B, the positive and negative DC inputs of the power inverter 306 can be connected to the positive and negative outputs of the battery 304 using wires 390, 392, respectively. For example, according to an embodiment, each wire 390, 392 can be connected to the post 380, 382, which is connected to the positive and negative outputs of the battery 304, respectively. The wires 390, 392 can be connected to the posts 380, 382 using threaded fasteners, as shown, or alternatively, by soldering or other techniques known in the art.

Referring back to FIGS. 1 and 2A-2C, and as discussed above, embodiments of the integrated battery 100 can have the same general exterior dimensions and/or mounting features as a conventional vehicle battery, allowing the integrated battery to serve as a drop-in replacement for a vehicle's existing battery. As shown in FIG. 1, integrated battery 100 can define a "maximum" height Z between the bottom-most surface B of the outer housing and upper-most surface U of the positive and negative terminals 110, 112. Alternatively, in the event the positive and negative terminals 110, 112 are not located on the top surface 114 of outer housing 102, the "maximum" height can be measured between the bottom-most surface B and the top surface 114 of outer housing 102.

Referring to FIG. 2A, the integrated battery 100 can define a "maximum" length X between the opposed right end R and left end L. The integrated battery 100 can also define a "maximum" width Y between the opposed front side FR and rear side RR. According to an embodiment, the integrated battery 100 defines a maximum length X of between about 7 inches and about 21 inches, a maximum width Y of between about 4 inches and about 12 inches, and a maximum height Z of between about 6 inches and about 12 inches. According to another embodiment, the integrated battery 100 defines a maximum length X of between about 10 inches and about 15 inches, a maximum width Y of between about 6 inches and about 8 inches, and a maximum height Z of between about 8 inches and about 10 inches. One of ordinary skill in the art will understand from this disclosure, however, that a wide variety of dimensions are possible for integrated battery 100, depending, for example, on the requirements of the vehicle in which integrated battery 100 will be used. In addition, while the foregoing description of dimensions is made with respect to the embodiment of integrated battery 100 shown in FIGS. 1 and 2A-2C, the same dimensions can also apply to the integrated batteries 200 and 300 shown in FIGS. 5 through 9B.

According to another aspect of the invention, a shell for an integrated battery can be provided separately from the battery itself, allowing, for example, the user to provide their own battery. For example, the shell can comprise the bottom portion 302A of the outer housing 302 as shown in FIG. 7, and the top portion 302B, power inverter 306, and related components as shown in FIGS. 9A and 9B. According to an embodiment, the user can install a battery of their choice into the hollow interior region 370 of the bottom portion 302A, connect the posts 380, 382 to the battery's positive and negative outputs, respectively, and then install the top cover 302B and related components shown in FIGS. 9A and 9B onto the open top 372. This will enclose the unit. The shell may be offered in a variety of dimensions to accommodate a variety of sizes and types of batteries. Accordingly, an embodiment of the shell may have the same ranges of dimensions discussed above in connection with FIGS. 1 and 2A. Although the shell is described in connection with the embodiment of integrated battery 300 shown in FIGS. 6 through 9B, the shell embodiment is also possible using the embodiments of integrated battery 100 and 200 shown in FIGS. 1 through 5, among others.

Another aspect of the invention relates to a method of making the integrated battery. Referring to FIG. 7 for illustration purposes, the method can comprise providing the outer housing 302, for example, the bottom portion 302A and the top portion 302B. These parts of the integrated battery, as well as the power panel 322 and covers 352, if provided, can be formed of a plastic material, for example, by injection molding. However, other materials, such as composites and metals, are also possible.

Still referring to FIG. 7, the method can further comprise inserting the battery 304 into the hollow interior portion 370 of the bottom portion 302A. The top cover 302B can be attached to the open top portion 372 to conceal the battery 304 in bottom portion 302A, for example, by bonding, ultrasonic welding, fasteners, or by snap connectors. According to an embodiment, partition plate 378 can be installed over battery 304 prior to attaching the top cover 302B. The method can further include installing the power inverter 306 into the cavity 376 in top cover 302B, and attaching power panel 322 (including the AC sockets 318) to the top cover 302B, for example, by bonding, ultrasonic welding, fasteners, or by snap connectors.

Still referring to FIG. 7, the method can also include making the necessary electrical connections for the battery 304 and the power inverter 306. For example, the DC input of the power inverter can be connected to the positive and negative outputs of the battery 384, 386 (see FIG. 8) via posts 380, 382 and wires 390, 392 (FIGS. 9A and 9B), respectively. These electrical connections can be made, for example, using mechanical connectors such as fasteners, clamps, or crimps, by soldering, or by forced contact. The battery's positive and negative outputs 384, 386 can also be coupled to the positive and negative terminals 310, 312, respectively, for example, by threading the end of posts 380, 382 into the positive and negative outputs 384, 386, or by soldering. The method can further include making an electrical connection between the power inverter's AC output and the sockets 318. Furthermore, if provided, the threaded pads 360 can be attached to the outer housing and electrically connected to the positive and negative outputs 384, 386 of battery 304.

The method of making the integrated battery is not limited to the specific order described above, and can be performed in a variety of different sequences. In addition, although the method is described in connection with the embodiment of integrated battery 300 shown in FIGS. 6 through 9B, embodiments of the method are also possible using the embodiments of integrated battery 100 and 200 shown in FIGS. 1 through 5, among others.

The embodiments illustrated and discussed in this specification are intended only to teach those skilled in the art the best way known to the inventors to make and use the invention. Nothing in this specification should be considered as limiting the scope of the present invention. All examples presented are representative and non-limiting. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

The invention claimed is:

1. An integrated DC and AC power supply constructed to fit into a space provided in a vehicle for an existing battery, comprising:
    an outer housing having a positive terminal and a negative terminal located exterior to the outer housing;
    a partition inside the outer housing defining a battery compartment and a second compartment, the partition constructed to at least one of conductively and thermally isolate the battery compartment from the second compartment;
    a battery located in the battery compartment of the outer housing, the battery having a positive output and a negative output that together output a DC current, wherein the positive output is coupled to the positive terminal and the negative output is coupled to the negative terminal;
    a power inverter located in the second compartment of the outer housing, the power inverter having a DC input coupled to the positive and negative outputs of the battery, and an AC output accessible from an exterior of the outer housing; and an AC socket coupled to the AC output;
wherein the outer housing of the integrated DC and AC power supply has dimensions to fit in the space provided for the existing battery so that the integrated power system comprises a drop-in replacement for the existing battery.

2. The integrated DC and AC power supply of claim 1, wherein the outer housing includes a top surface, and the positive and negative terminals extend from the top surface of the outer housing.

3. The integrated DC and AC power supply of claim 1, wherein the AC socket is located on an exterior surface of the outer housing.

4. The integrated DC and AC power supply of claim 1, further comprising:
a cable extending from the AC output of the power inverter to the AC socket, wherein the AC socket is located remotely from the outer housing.

5. The integrated DC and AC power supply of claim 1, further comprising:
a switch adapted to turn the power inverter on and off.

6. The integrated DC and AC power supply of claim 1, wherein the battery compartment is a hollow space located below the second compartment and having an open top.

7. The integrated DC and AC power supply of claim 6, wherein the partition comprises a top cover located on the open top and covering the battery compartment, wherein the power inverter is housed in the top cover.

8. The integrated DC and AC power supply of claim 7, wherein the positive terminal and the negative terminal extend from the top cover.

9. The integrated DC and AC power supply of claim 1, further comprising a USB port located on the outer housing and powered by the battery.

10. The integrated DC and AC power supply of claim 1, wherein the vehicle battery is generally rectangular and defines a maximum length of between about 7 inches and about 21 inches, a maximum width of between about 4 inches and about 12 inches, and a maximum height of between about 6 inches and about 12 inches.

11. A shell for use with a vehicle battery and a power inverter to form an integrated DC and AC power supply, the shell comprising:
an outer housing;
a partition inside the outer housing defining a battery compartment adapted to hold a battery and a second compartment, the partition constructed to at least one of conductively and thermally isolate the battery compartment from the second compartment;
a positive terminal and a negative terminal located exterior to the outer housing, the positive and negative terminals extending into the battery compartment and adapted to couple to a positive output and a negative output of the battery, respectively;
a power inverter located in the second compartment of the outer housing, the power inverter having a DC input adapted to couple to the positive and negative outputs of the battery, the power inverter also having an AC output; and
an AC socket connected to the AC output;
wherein the outer housing has dimensions to fit in a space of a vehicle provided for an existing battery so that the integrated DC and AC power supply comprises a drop-in replacement for the existing battery.

12. The shell of claim 11, wherein the outer housing includes a top surface, and the positive and negative terminals extend from the top surface of the outer housing.

13. The shell of claim 11, wherein the AC socket is located on an exterior surface of the outer housing.

14. The shell of claim 11, further comprising:
a cable extending from the AC output of the power inverter to the AC socket, wherein the AC socket is located remotely from the outer housing.

15. The shell of claim 11, wherein the battery compartment is located below the second compartment and the outer housing includes an open top, and the shell further comprises a top cover covering the open top, wherein the power inverter is housed in the top cover.

16. The shell of claim 11, further comprising a USB port located on the outer housing and adapted to be powered by the battery.

17. The shell of claim 11, wherein the shell is generally rectangular and defines a maximum length of between about 7 inches and about 21 inches, a maximum width of between about 4 inches and about 12 inches, and a maximum height of between about 6 inches and about 12 inches.

18. A method of making an integrated DC and AC power supply for a vehicle, the method comprising:
providing an outer housing having a hollow interior region and outer dimensions to fit in a space of a vehicle provided for an existing battery so that the integrated DC and AC power supply comprises a drop-in replacement for the existing battery;
inserting a battery into a first portion of the hollow interior region, the battery having a positive output and a negative output and providing DC power suitable for powering DC systems of the vehicle;
separating the first portion of the hollow interior region containing the battery with a partition to at least one of conductively and thermally separate the hollow interior region containing the battery from a second portion of the hollow interior region of the outer housing;
installing a power inverter in the second portion of the outer housing;
coupling a DC input of the power inverter to the positive and negative outputs of the battery, wherein the power inverter has an AC output;
coupling the positive output of the battery to a positive terminal located exterior to the outer housing;
coupling the negative output of the battery to a negative terminal located exterior to the outer housing; and
coupling an AC socket of the power inverter to the AC output of the power inverter.

19. The method of claim 18, wherein installing the power inverter in the outer housing comprises:
attaching a top cover to an open top portion of the outer housing; and
installing the power inverter in the top cover.

20. The method of claim 18, further comprising:
mounting the AC socket to the outer housing.

21. The method of claim 18, further comprising:
connecting a cable between the AC output of the power inverter and the AC socket, wherein the AC socket is located remotely from the outer housing.

22. The method of claim 18, wherein the outer housing is generally rectangular and defines a maximum length of between about 7 inches and about 21 inches, a maximum width of between about 4 inches and about 12 inches, and a maximum height of between about 6 inches and about 12 inches.

23. The integrated DC and AC power system of claim 1, further comprising:

a remote module located remotely from the outer housing and connected to the outer housing by a cable, wherein the AC socket is located on the remote module;

a USB port located on the remote module and electrically coupled to the battery by the cable; and a switch located on the remote module and adapted to turn at least one of the power inverter or the USB port on an off.

24. The integrated DC and AC power system of claim 1, wherein the outer housing is adapted with mounting features to fix the outer housing in the space provided in the vehicle for the existing battery.

25. The shell of claim 11, wherein the outer housing is adapted with mounting features to fix the outer housing in the space provided in the vehicle for the existing battery.

26. The method of claim 18, including providing the housing with mounting features to fix the housing containing the battery and the power inverter in the space provided in the vehicle for the existing battery.

* * * * *